United States Patent
Li

(10) Patent No.: US 10,217,959 B2
(45) Date of Patent: Feb. 26, 2019

(54) PACKAGING MATERIAL INCLUDING RARE EARTH METAL OXIDE, ORGANIC LIGHT-EMITTING DIODE DEVICE AND METHOD FOR PACKAGING THE SAME

(71) Applicant: BOE TECHNOLOGY GROUP CO., LTD., Beijing (CN)

(72) Inventor: Na Li, Beijing (CN)

(73) Assignee: BOE TECHNOLOGY GROUP CO., LTD. (CN)

(*) Notice: Subject to any disclaimer, the term of this patent is extended or adjusted under 35 U.S.C. 154(b) by 9 days.

(21) Appl. No.: 15/502,577

(22) PCT Filed: Jul. 25, 2016

(86) PCT No.: PCT/CN2016/091581
§ 371 (c)(1),
(2) Date: Feb. 8, 2017

(87) PCT Pub. No.: WO2017/016461
PCT Pub. Date: Feb. 2, 2017

(65) Prior Publication Data
US 2018/0138443 A1    May 17, 2018

(30) Foreign Application Priority Data
Jul. 27, 2015 (CN) .......... 2015 1 0446094

(51) Int. Cl.
*H01L 51/50* (2006.01)
*H01L 51/52* (2006.01)
(Continued)

(52) U.S. Cl.
CPC .......... *H01L 51/5246* (2013.01); *H01L 51/50* (2013.01); *H01L 51/56* (2013.01)

(58) Field of Classification Search
CPC ... H01L 51/5246; H01L 51/524; H01L 51/56; C03C 8/24; C03C 27/06; H05B 33/04
(Continued)

(56) References Cited

U.S. PATENT DOCUMENTS 5,747,397 A * 5/1998 McPherson ............. C03C 3/068
501/50
2003/0158289 A1* 8/2003 Rusin ................... A61K 6/0073
523/117
(Continued)

FOREIGN PATENT DOCUMENTS

CN    1915877 A      2/2007
CN    104628252 A *  5/2015
(Continued)

OTHER PUBLICATIONS

First Office Action for Chinese Application No. 201510446094.X, dated Aug. 3, 2016, 7 Pages.
International Search Report and Written Opinion for Application No. PCT/CN2016/091581, dated Oct. 31, 2016, 13 Pages.

*Primary Examiner* — Nduka E Ojeh
(74) *Attorney, Agent, or Firm* — Brooks Kushman P.C.

(57) ABSTRACT

The present disclosure provides a packaging material, an OLED device and a method for packaging the OLED device. The packaging material for a transparent device includes a primary ingredient including a rare earth metal oxide, zinc oxide, aluminum oxide and silicon dioxide, and an adhesive for adhering the primary ingredient. The rare earth metal oxide has a primary adsorption wavelength within a wavelength range of infrared or ultraviolet light.

10 Claims, 1 Drawing Sheet

(51) Int. Cl.
*H01L 51/56* (2006.01)
*H01L 29/08* (2006.01)
*H01L 35/24* (2006.01)
*H01L 51/00* (2006.01)

(58) Field of Classification Search
USPC ......... 257/100, 40; 313/512; 438/27, 29, 82, 438/99
See application file for complete search history.

(56) References Cited

U.S. PATENT DOCUMENTS

| | | | |
|---|---|---|---|
| 2004/0206953 A1 | 10/2004 | Morena et al. | |
| 2008/0044488 A1* | 2/2008 | Zimmer | B82Y 30/00 424/600 |
| 2011/0255154 A1* | 10/2011 | Nagase | G02B 5/208 359/352 |
| 2015/0287771 A1* | 10/2015 | Lee | H01L 27/3276 257/40 |
| 2015/0360994 A1* | 12/2015 | Maeda | C03C 8/04 501/70 |
| 2016/0369956 A1* | 12/2016 | Park | H01L 51/0097 |

FOREIGN PATENT DOCUMENTS

| | | |
|---|---|---|
| CN | 104628256 A | 5/2015 |
| CN | 104966788 A | 10/2015 |

\* cited by examiner

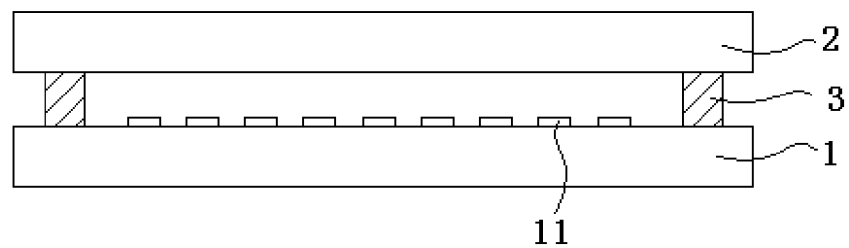

PACKAGING MATERIAL INCLUDING RARE EARTH METAL OXIDE, ORGANIC LIGHT-EMITTING DIODE DEVICE AND METHOD FOR PACKAGING THE SAME

CROSS-REFERENCE TO RELATED APPLICATIONS

This application is the U.S. national phase of PCT Application No. PCT/CN2016/091581 filed on Jul. 25, 2016, which claims priority to Chinese Patent Application No. 201510446094.X filed on Jul. 27, 2015, the disclosures of which are incorporated in their entirety by reference herein.

TECHNICAL FIELD

The present disclosure relates to the field of packaging technology, in particular to a packaging material, an organic light-emitting diode (OLED) device and a method for packaging the OLED device.

BACKGROUND

An OLED device, as a newly emerging display device, has attracted more and more attentions due to its advantages such as excellent contrast, self-luminescence, wide viewing angle, being of a thin-type, rapid response and low power consumption. However, the performance of an OLED, particularly an electrode and an organic layer thereof, may be degraded due to oxygen and moisture from an ambient environment entering the OLED display device, and at this time, its service life may be seriously reduced. In the case that the electrode and the organic layer of the OLED are hermetically isolated from the ambient environment (i.e., in the case that they are packaged), it is able to remarkably increase the service life of the OLED.

However, it is very difficult to hermetically isolate the electrode and the organic layer of the OLED from the ambient environment. In the related art, the OLED is sealed between two substrates using a packaging structure, with a resistance to oxygen of $10^{-3}$ cm$^3$/m$^2$/day and a resistance to moisture of $10^{-6}$ g/m$^2$/day. In addition, the packaging structure may be provided with a width as small as possible (e.g., 1 mm), so as to prevent a size of the OLED device from being adversely affected. Further, the packaging procedure may be performed at a temperature as low as possible, so as to prevent the electrode and the organic layer of the OLED from being adversely affected. During the packaging, usually a pixel at a distance of 1 to 2 mm from the packaging structure may be at a temperature not greater than 1000° C. In addition, the packaging structure may be made of an electrically insulating material, so that an electrical element (e.g., an external membrane electrode) may be inserted through the packaging structure and into the OLED.

Currently, such laser packaging techniques as laser scanning packaging, laser point heating packaging and matrix laser packaging are mainly adopted. The laser scanning packaging technique refers to projecting a laser beam onto a packaging material (frit) at a surface of the to-be-packaged OLED device, and moving the laser beam along a profile of the packaging material so as to fuse the packaging material and complete the entire packaging procedure. The laser point heating packaging technique refers to performing laser point packaging at different positions of the packaging material, so as to complete the entire packaging procedure.

In order to increase the absorption of the packaging material (the frit) to the laser beam, usually such a metal oxide as bismuth oxide or vanadium oxide needs to be added into the packaging material. However, the metal oxide may become black after being fused by the laser beam and then solidified, and it may be visible from the outside in the case that it is applied to a transparent display device or any other element such as a transparent light source. As a result, the appearance of the entire product will be adversely affected.

SUMMARY

An object of the present disclosure is to provide a packaging material, an OLED device and a method for packaging the OLED device, so as to provide a transparent packaging structure and apply the packaging material to a transparent device.

In one aspect, the present disclosure provides in some embodiments a packaging material for a transparent device, including a primary ingredient including a rare earth metal oxide, zinc oxide, aluminum oxide and silicon dioxide, and an adhesive for adhering the primary ingredient. The rare earth metal oxide has a primary adsorption wavelength within a wavelength range of infrared or ultraviolet light.

In a possible embodiment of the present disclosure, the rare earth metal oxide is a lanthanide metal oxide.

In a possible embodiment of the present disclosure, the lanthanide metal oxide includes one or more of ytterbium oxide, cerium oxide, europium oxide, terbium oxide, and gadolinium oxide.

In a possible embodiment of the present disclosure, the primary ingredient includes 40-80 wt % of the rare earth metal oxide, 1-20 wt % of zinc oxide, 2-20 wt % of aluminum oxide and 5-20 wt % of silicon dioxide.

In a possible embodiment of the present disclosure, the primary ingredient is in a power form.

In another aspect, the present disclosure provides in some embodiments an OLED device, including: a first substrate; a second substrate arranged opposite to the first substrate; an OLED arranged between the first substrate and the second substrate; and a packaging structure arranged between the first substrate and the second substrate and configured to surround the OLED. The packaging structure is formed by curing the above-mentioned packaging material.

In a possible embodiment of the present disclosure, the OLED device is a transparent OLED device.

In yet another aspect, the present disclosure provides in some embodiments a method for packaging an OLED device, including steps of: providing a first substrate including at least one OLED; providing a second substrate; providing the above-mentioned packaging material on the first substrate or the second substrate; enabling the first substrate to be aligned with the second substrate so that the packaging material surrounds the OLED; and curing the packaging material so as to form a packaging structure.

In a possible embodiment of the present disclosure, the step of curing the packaging material includes fusing and then curing the packaging material.

In a possible embodiment of the present disclosure, the step of fusing the packaging material includes irradiating the packaging material with a laser beam and fusing the packaging material.

In a possible embodiment of the present disclosure, the laser beam has a wavelength of 200 to 1200 nm.

In a possible embodiment of the present disclosure, the laser beam is an infrared or ultraviolet beam.

In a possible embodiment of the present disclosure, a semiconductor laser is used as a laser source, and a to-be-packaged element is an OLED device.

In a possible embodiment of the present disclosure, the method includes steps of: providing two glass substrates; screen-printing the formulated packaging material (a frit) onto an upper glass substrate; pre-sintering the packaging material so as to deposit the packaging material onto the upper glass substrate; enabling the upper glass substrate to be aligned with a lower glass substrate where the OLED is formed, so as to form a hermetic OLED device (e.g., a transparent OLED display device); heating the packaging material using a radiation source (e.g., an infrared laser beam or an ultraviolet laser beam) so as to fuse the packaging material; curing the packaging material to form the packaging structure and adhere the two glass substrates to each other, thereby to form a complete sealant structure. Through the sealant structure, it is able to prevent the OLED and an external membrane electrode from being damaged, and prevent oxygen and moisture from entering the OLED device.

According to the embodiments of the present disclosure, the packaging material may be used for packaging the OLED device.

BRIEF DESCRIPTION OF THE DRAWINGS

FIG. 1 is a sectional view of an OLED device according to one embodiment of the present disclosure.

REFERENCE SIGN LIST 1 array substrate
11 OLED
2 packaging substrate
3 packaging structure

DETAILED DESCRIPTION

The present disclosure will be described hereinafter in conjunction with the drawings and embodiments. The following embodiments are for illustrative purposes only, but shall not be used to limit the scope of the present disclosure.

The present disclosure provides in some embodiments a packaging material for a transparent device, including a primary ingredient including a rare earth metal oxide, zinc oxide, aluminum oxide and silicon dioxide, and an adhesive for adhering the primary ingredient. The rare earth metal oxide has a primary adsorption wavelength within a wavelength range of infrared or ultraviolet light.

It should be appreciated that, a substance may selectively adsorb an optical wave. For example, in the case of absorbing white light or light from a light source with a wide spectrum, the substance may absorb the light within a certain wavelength range in a very strong manner. Hence, the primary adsorption wavelength just refers to a wavelength of the light that may be maximally adsorbed by the substance.

In a possible embodiment of the present disclosure, the rare earth metal oxide may be a lanthanide metal oxide. The lanthanide metal oxide may include one or more of ytterbium oxide ($Yb_2O_3$), cerium oxide ($Ce_2O_3$), europium oxide ($Eu_2O_3$), terbium oxide ($Tb_2O_3$), and gadolinium oxide ($Gd_2O_3$). The primary adsorption wavelengths of these five lanthanide metal oxides may be 975 nm, 210-251 nm, 375-394 nm, 284-477 nm, and 272-275 nm, respectively. The primary adsorption wavelengths essentially fall within the wavelength range of infrared or ultraviolet light, which are invisible. Hence, a packaging structure formed by the packaging material is colorless and transparent. In the case that the packaging material is applied for transparent display, a display effect will not be adversely affected, and the resultant product will be provided with well appearance. In addition, the packaging structure formed by the packaging material is colorless and transparent, so it is able to be applied for a colorless, transparent OLED device.

In addition, the components of the primary ingredient of the packaging material may cooperate with each other, so as to reduce a melting point of the packaging material, thereby to minimize the influence on the OLED during the packaging procedure. In addition, a thermal expansion coefficient of the packaging material may be fit to a glass substrate, and during the packaging procedure, the packaging material may be distributed evenly. Hence, the packaging material may not be shifted or deformed during a heating procedure, and no bubbles may occur. In this way, it is able to improve the hermeticity, prevent the OLED form being damaged by oxygen and moisture, and adhere the two substrates to each other in a better manner. Further, the packaging material is electrically insulated, so as to protect an external membrane electrode.

In a possible embodiment of the present disclosure, the primary ingredient of the packaging material includes 40-80 wt % of the rare earth metal oxide, 1-20 wt % of zinc oxide, 2-20 wt % of aluminum oxide and 5-20 wt % of silicon dioxide. It is found that, in the case that the primary ingredient includes the components at the above-mentioned contents, it is able to improve the performance of the resultant packaging material.

In a possible embodiment of the present disclosure, the components of the primary ingredient are all in a powder form. In other words, the primary ingredient of the packaging material may be, e.g., a frit obtained by mixing the components in the powder form, so as to facilitate the preparation thereof and mix the components evenly. Generally speaking, each component may have a particle size of 0.1 µm to 10 µm.

In a possible embodiment of the present disclosure, the adhesive is configured to adhere the components in the powder form, so as to form a solid, block-like product. In this way, the block-like packaging material may be directly placed onto the substrate, so as to facilitate the operation.

Examples of the adhesive may include nitrocellulose or ethylcellulose. The adhesive may be provided at an amount sufficient to adhere the components in the powder form, usually 0.5 ml/g frit, i.e., 0.5 ml of the adhesive may be used for one gram of frit.

The present disclosure further provides in some embodiments an OLED device, including: a first substrate; a second substrate arranged opposite to the first substrate; an OLED arranged between the first substrate and the second substrate; and a packaging structure arranged between the first substrate and the second substrate and configured to surround the OLED. The packaging structure is formed by curing the above-mentioned packaging material.

In a possible embodiment of the present disclosure, as shown in FIG. 1, the OLED device includes two substrates, i.e., an array substrate 1 and a packaging substrate 2, and the OLED 11 is arranged on the array substrate 1. The packaging structure 3 (which is made of a frit) is arranged between the two substrates 1, 2 and surrounds the OLED 11. In this way, it is able to seal the OLED 11 within a space defined by the two substrates and the packaging structure 3. The packaging structure 3 is formed by curing the above-mentioned packaging material.

The OLED device may be an OLED display device for displaying an image, or an element containing the OLED, e.g., a light source.

In a possible embodiment of the present disclosure, the OLED device may be a transparent OLED device, e.g., a transparent OLED display device.

The present disclosure further provides in some embodiments a method for packaging an OLED device, including steps of: providing a first substrate including at least one OLED; providing a second substrate; providing the above-mentioned packaging material on the first substrate or the second substrate; enabling the first substrate to be aligned with the second substrate so that the packaging material surrounds the OLED; and curing the packaging material so as to form a packaging structure.

In a possible embodiment of the present disclosure, the step of curing the packaging material includes fusing and then curing the packaging material.

To be specific, the packaging material may be arranged at a predetermined region on any one of the two substrates (e.g., the packaging substrate 2), then the two substrates (e.g., the packaging substrate 2 and the array substrate 1) may be aligned with each other to form a cell, and then the packaging material may be fused (e.g., through a laser beam) and cured, so as to form the packaging structure, thereby to adhere the two substrates and seal the OLED.

In addition, the to-be-packaged element may be an OLED device, i.e., a glass shell may be formed by the packaging material so as to seal the OLED device.

In a possible embodiment of the present disclosure, the step of fusing the packaging material includes irradiating the packaging material with a laser beam and fusing the packaging material.

In a possible embodiment of the present disclosure, the laser beam has a wavelength of 200 to 1200 nm. The laser beam is an infrared or ultraviolet beam.

In a possible embodiment of the present disclosure, the method for packaging the OLED device may include steps of: providing two glass substrates, with the OLED 11 being arranged on the array substrate 1; screen-printing the formulated packaging material onto the packaging substrate 2; pre-sintering the packaging material so as to deposit the packaging material onto the packaging substrate 2; enabling the packaging substrate 2 to be aligned with the array substrate 1, so as to form a hermetic OLED device; heating the packaging material using a radiation source (e.g., an infrared laser beam or an ultraviolet laser beam) so as to fuse the packaging material; curing the packaging material to form the packaging structure 3 and adhere the two substrates to each other, thereby to form a complete sealant structure (e.g., the OLED display device). Through the sealant structure, it is able to prevent the OLED and an external membrane electrode from being damaged, and prevent oxygen and moisture from entering the OLED device.

In other words, the laser beam may have a wavelength within the above-mentioned range. In the embodiments of the present disclosure, the primary adsorption wavelength of the rare earth metal oxide may fall within the wavelength range of invisible light, so the laser beam may be an infrared or ultraviolet laser beam. In a possible embodiment of the present disclosure, the laser beam may have a wavelength of 200 to 400 nm, or 760 to 1200 nm. The wavelength of the laser beam may be determined in accordance with the types of the rare earth metal oxide. In the case that the rare earth metal oxide includes $Yb_2O_3$, the laser beam having a wavelength of 760 to 1200 nm may be selected, and in the case that the rare earth metal oxide includes $Ce_2O_3$, $Eu_2O_3$, $Tb_2O_3$ and $Gd_2O_3$, the laser beam having a wavelength of 200 to 400 nm may be selected.

EXAMPLES

The preparation of different packaging materials, the resultant packaging structure and the performance of the packaging structure will be described hereinafter.

In addition, in the embodiments of the present disclosure, the packaging material and the resultant structure will be formed through the following steps.

Step S01: adding the components of the primary ingredient in the powder form, at the mentioned weight percentages and at a total amount of 10 g, into an agate mortar, adding 2 ml of alcohol into the agate mortar, and grinding and mixing the powder for 10 minutes.

Step S02: after the complete volatilization of alcohol, adding the adhesive (e.g., 5 g of ethylcellulose (or nitrocellulose)) which is dissolved in a solvent (e.g., 2 g of amyl acetate), and stirring to acquire a paste.

Step S03: placing the paste in a vacuum environment for 10 minutes, so as to fully release a gas in the paste.

Step S04: screen-printing the paste onto a glass substrate, so as to form the strip-like packaging material.

Step S05: pre-sintering the packaging material at a temperature of 150 to 200° C. for 60 minutes, and maintaining the packaging material at a temperature of 350° C. for 20 minutes, so as to fully remove the adhesive and form the cured, strip-like packaging material on the glass substrate.

Step S06: polishing an upper surface of the packaging material, and aligning the glass substrate with another substrate to form a cell.

Step S07: heating the packaging material using a laser beam having a wavelength of 200 to 1200 nm to fuse the packaging material, and then curing the fused packaging material to form the packaging structure. A laser having output power of 37.5 W may be used to generate the laser beam, and the laser beam may move along the profile of the packaging material at a speed of 2 mm/s. In addition, the laser beam may have a diameter smaller than a width of the strip-like packaging material, and during the heating, a certain pressure may also be applied to the substrates.

According to the embodiments of the present disclosure, during the packaging, the packaging material may be deformed at a small amount and a small thermal stress may be generated, so the laser and the laser beam are not highly demanded. To be specific, a semiconductor laser may be adopted, and such techniques as laser scanning packaging, laser point heating packaging and matrix laser packaging may be applied. Here, the laser scanning packaging technique may be selected, so as to facilitate the operation.

Step S08: measuring the following parameters of the resultant packaging structure.

(1) Thermal Expansion Coefficient

A thermal expansion coefficient of a sample may be measured using a thermomechanic analyzer (e.g. XYW-500B).

(2) Water-Oxygen Transmittance

The water-oxygen transmittance may be measured as follows. A metal electrode pattern may be formed on a to-be-measured back plate, and a calcium film may be formed on the back plate. Then, the back plate with the metal electrode pattern and the calcium film may serve as a partition plate for partitioning a drying chamber and a moist chamber. A change value of a conductivity of the calcium film may be measured through the metal electrode pattern, and the water-oxygen transmittance may be calculated in accordance with the change value.

To be specific, the primary ingredient of the packaging material and the parameters of the resultant packaging structure will be described hereinafter.

Example 1

In this example, the primary ingredient of the packaging material includes 40 wt % of $Yb_2O_3$ (rare earth metal oxide), 20 wt % of zinc oxide, 20 wt % of aluminum oxide, and 20 wt % of silicon dioxide. The laser beam for the packaging has a wavelength of 975 nm. The packaging structure formed by the packaging material is colorless and transparent, and has a thermal expansion coefficient of $-85\times10^{-7}$/° C., a resistance to oxygen of $0.8\times10^{-3}$ cm$^3$/m$^2$/day, and a resistance to moisture of $0.75\times10^{-6}$ g/m$^2$/day.

Example 2

In this example, the primary ingredient of the packaging material includes 80 wt % of $Ce_2O_3$ (rare earth metal oxide), 1 wt % of zinc oxide, 14 wt % of aluminum oxide, and 5 wt % of silicon dioxide. The laser beam for the packaging has a wavelength of 244 nm. The packaging structure formed by the packaging material is colorless and transparent, and has a thermal expansion coefficient of $-75\times10^{-7}$° C., a resistance to oxygen of $0.77\times10$ cm$^{-3}$/m$^2$/day, and a resistance to moisture of $0.7\times10^{-6}$ g/m$^2$/day.

Example 3

In this example, the primary ingredient of the packaging material includes 75 wt % of $Eu_2O_3$ and $Tb_2O_3$ (rare earth metal oxides, at a mass ratio of 1:1), 13 wt % of zinc oxide, 2 wt % of aluminum oxide, and 10 wt % of silicon dioxide. The laser beam for the packaging has a wavelength of 364 nm. The packaging structure formed by the packaging material is colorless and transparent, and has a thermal expansion coefficient of $-91\times10^{-7}$/° C., a resistance to oxygen of $0.88\times10^{-3}$ cm$^3$/m$^2$/day, and a resistance to moisture of $0.9*10^{-6}$ g/m$^2$/day.

Example 4

In this example, the primary ingredient of the packaging material includes 60 wt % of $Gd_2O_3$ (rare earth metal oxide), 12 wt % of zinc oxide, 13 wt % of aluminum oxide, and 15 wt % of silicon dioxide. The laser beam for the packaging has a wavelength of 257 nm. The packaging structure formed by the packaging material is colorless and transparent, and has a thermal expansion coefficient of $-101\times10^{-7}$/° C., a resistance to oxygen of $0.91\times10^{-3}$ cm$^3$/m$^2$/day, and a resistance to moisture of $0.88*10^{-6}$ g/m$^2$/day.

According to the embodiments of the present disclosure, the packaging structure formed by the packaging material is colorless and transparent. In the case that the packaging material is applied to a transparent OLED display device (or a transparent light source containing an OLED), a display effect will not be adversely affected, and the resultant product will be provided with well appearance. In addition, the packaging material has a small thermal expansion coefficient, and it is able to be fit to the glass substrate. Hence, the packaging material may not be deformed or shifted during the heating procedure, and no bubbles may occur. In this way, it is able to adhere the two substrates to each other in a better manner and improve the hermeticity.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A packaging material for a transparent device, comprising:
   a primary ingredient comprising a rare earth metal oxide, zinc oxide, aluminum oxide and silicon dioxide; and
   an adhesive for adhering the primary ingredient,
   wherein the rare earth metal oxide has a primary adsorption wavelength within a wavelength range of infrared or ultraviolet light,
   wherein the primary ingredient comprises 40 wt % of $Yb_2O_3$, 20 wt % of zinc oxide, 20 wt % of aluminum oxide, and 20 wt % of silicon dioxide; or the primary ingredient comprises 75 wt % of $Eu_2O_3$ and $Tb_2O_3$ at a mass ratio of 1:1, 13 wt % of zinc oxide, 2 wt % of aluminum oxide, and 10 wt % of silicon dioxide.

2. The packaging material according to claim 1, wherein the primary ingredient is in a power form.

3. An organic light-emitting diode (OLED) device, comprising:
   a first substrate;
   a second substrate arranged opposite to the first substrate;
   an OLED arranged between the first substrate and the second substrate; and
   a packaging structure arranged between the first substrate and the second substrate and configured to surround the OLED,
   wherein the packaging structure is formed by curing a packaging material,
   the packaging material comprises a primary ingredient comprising a rare earth metal oxide, zinc oxide, aluminum oxide and silicon dioxide, and an adhesive for adhering the primary ingredient, and
   the rare earth metal oxide has a primary adsorption wavelength within a wavelength range of infrared or ultraviolet light,
   wherein the primary ingredient comprises 40 wt % of $Yb_2O_3$, 20 wt % of zinc oxide, 20 wt % of aluminum oxide, and 20 wt % of silicon dioxide; or the primary ingredient comprises 75 wt % of $Eu_2O_3$ and $Tb_2O_3$ at a mass ratio of 1:1, 13 wt % of zinc oxide, 2 wt % of aluminum oxide, and 10 wt % of silicon dioxide.

4. The OLED device according to claim 3, wherein the OLED device is a transparent OLED device.

5. A method for packaging an organic light-emitting diode (OLED) device, comprising steps of:
   providing a first substrate including at least one OLED;
   providing a second substrate;
   providing the packaging material according to claim 1 on the first substrate or the second substrate;
   enabling the first substrate to be aligned with the second substrate so that the packaging material surrounds the OLED; and
   curing the packaging material to form a packaging structure.

6. The method according to claim 5, wherein the step of curing the packaging material comprises fusing and then curing the packaging material.

7. The method according to claim 6, wherein the step of fusing the packaging material comprises irradiating the packaging material with a laser beam and fusing the packaging material.

8. The method according to claim 7, wherein the laser beam has a wavelength of 200 to 1200 nm.

9. The method according to claim 8, wherein the laser beam is an infrared laser beam.

10. The method according to claim 8, wherein the laser beam is an ultraviolet laser beam.

* * * * *